US012022615B2

United States Patent
Lee et al.

(10) Patent No.: US 12,022,615 B2
(45) Date of Patent: Jun. 25, 2024

(54) CIRCUIT BOARD MOUNTING SUPPORT

(71) Applicant: ACCTON TECHNOLOGY CORPORATION, Hsinchu (TW)

(72) Inventors: Dian-Hua Lee, Hsinchu (TW); Ru-Jing Jhang, Hsinchu (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 5 days.

(21) Appl. No.: 17/939,659

(22) Filed: Sep. 7, 2022

(65) Prior Publication Data

US 2023/0111518 A1    Apr. 13, 2023

(30) Foreign Application Priority Data

Oct. 13, 2021    (CN) .......................... 202122460800.X (51) Int. Cl.
H05K 1/14    (2006.01)
(52) U.S. Cl.
CPC ....... H05K 1/144 (2013.01); *H05K 2201/042* (2013.01)
(58) Field of Classification Search
CPC ..... H05K 1/144; H05K 2201/042; H05K 1/14
USPC ........................................................ 361/796
See application file for complete search history.

(56) References Cited

U.S. PATENT DOCUMENTS

2021/0222851 A1*    7/2021    Pirringer ............... F21S 41/322

* cited by examiner

*Primary Examiner* — Tremesha S Willis
(74) *Attorney, Agent, or Firm* — Birch, Stewart, Kolasch & Birch, LLP (57) ABSTRACT

A circuit board mounting support for supporting a first electronic circuit integration includes a bearing member. The first electronic circuit integration includes a circuit board, an electronic component engaged with a first surface of the circuit board, and multiple legs for engaging with the bearing member. The circuit board has a mounting area for mounting the electronic component and a second surface opposite to the first surface. The bearing member includes a groove and an engaging portion connected to a peripheral edge of the groove. A corresponding area is defined on the bearing member and corresponds to the mounting area of the circuit board. When the bearing member is engaged with the circuit board, an opening of the groove and the engaging portion face the second surface. A junction that each of the legs is engaged with the bearing member is located out of the corresponding area.

11 Claims, 7 Drawing Sheets

CIRCUIT BOARD MOUNTING SUPPORT

BACKGROUND OF THE INVENTION

Technical Field

The present disclosure relates generally to a circuit board equipment, and more particularly to a circuit board mounting support.

Description of Related Art

With advantages in technology, electronic devices have become indispensable in people's life.

The functional core of an electronic device lies in its electronic circuit integration including at least one circuit board and multiple various electronic components arranged on the circuit board, wherein the efficiency of the electronic circuit integration depends on not only the quality of its circuit design and performance of its electronic components but also environmental conditions in which the electronic circuit is integrated, such as temperature and humidity.

To enable the electronic circuit integration to have better heat dissipation capability, a set of circuit board mounting support is used to mount the electronic circuit integration on a body of the electronic device in addition to adding a heat dissipating apparatus (e.g. a heat sink) and a cooling fan to the electronic circuit integration.

Figure 1:
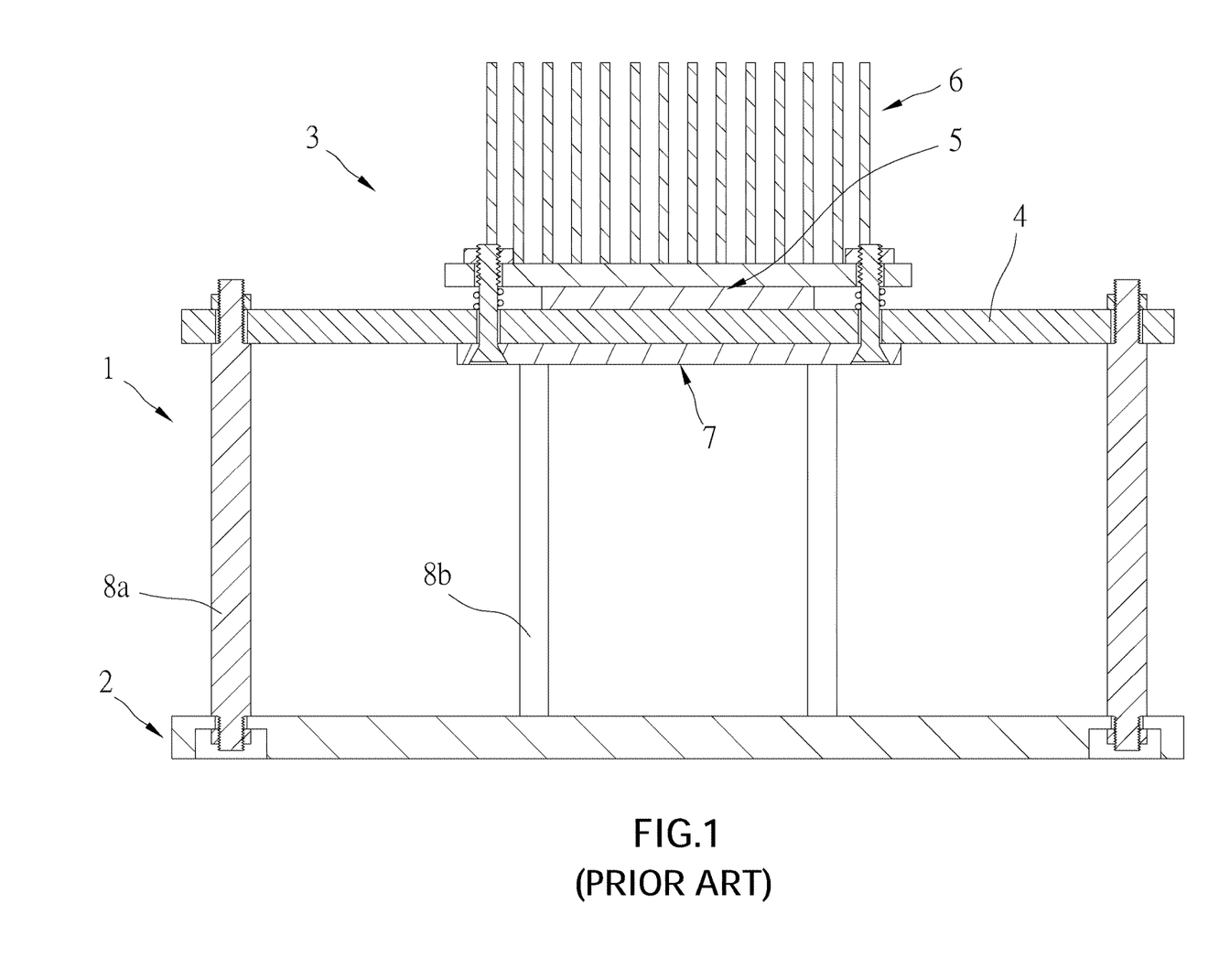
FIG. 1 is a schematic view of the conventional circuit board support mounted with one circuit board.

A conventional network switch shown in FIG. 1 is used as an example to illustrate. The network switch includes an electronic circuit integration 3, a set of circuit board mounting support 1, and a body 2 of an electronic device. To illustrate easily, the electronic circuit integration 3 is simplified to include a circuit board 4, an electronic component 5 (e.g. a central processing unit, CPU) disposed on the circuit board 4, and a heat sink 6, wherein the heat sink 6 is fixed on the circuit board 4 via a fixing plate 7, thereby the heat sink 6 abuts against a top surface of the electronic component 5 to dissipate heat generated by the operating electronic component 5.

The circuit board mounting support 1 includes a plurality of legs, wherein some of the legs (e.g. the legs 8a) are fixed on a peripheral area of the circuit board 4 and on the body 2, while the others of the legs (e.g. the legs 8b) are fixed on the fixing plate 7 and the body 2 to support the weight of the electronic component 5 and the heat sink 6.

Figure 2:
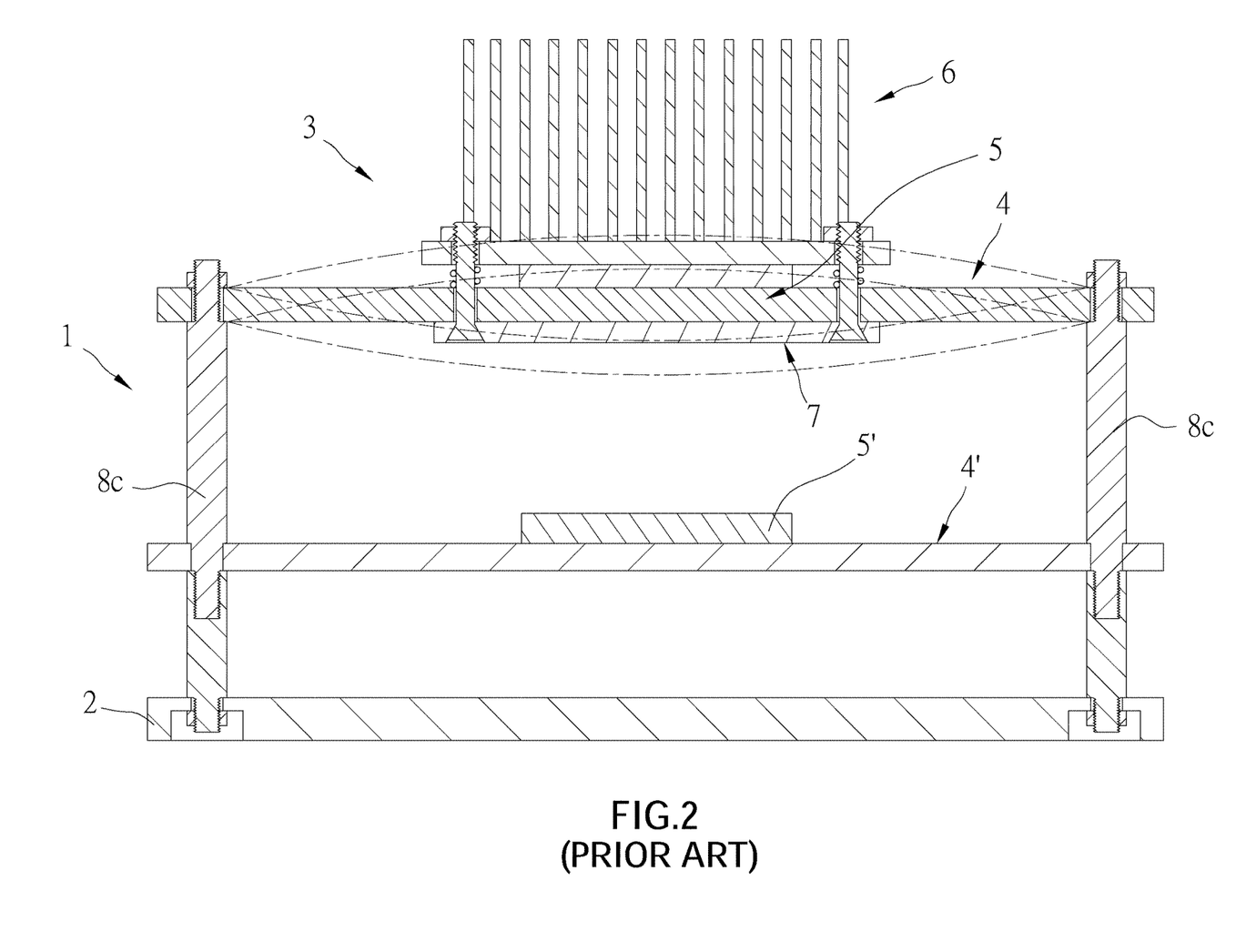
FIG. 2 is a schematic view of the conventional circuit board support mounted with multiple circuit boards.

However, with requirement of high performance, the electronic circuit integration 3 needs to be configured with more circuit boards 4, 4' and electronic components 5, 5', as shown in FIG. 2. Since more circuit boards 4, 4' and more electronic components 5, 5' are configured, a set of circuit board mounting support 1 is mounted on the circuit boards 4, 4' to provide the circuit boards 4, 4' on the body 2 in a way that respectively arranges the circuit boards 4, 4' at an upper layer and a lower layer. In order not to break a layout in a center of the lower circuit board 4', the legs 8c needs to be mounted in the peripheral area of the circuit board 4, 4', and the legs originally mounted below an area of the circuit board 4, 4' providing with the electronic components 5, 5' needs to be removed. However, when the network switch is operating, such configuration will cause the circuit boards 4, 4' to be flexure or warp due to vibration (e.g. a vibration generated when the cooling fan is running), which is easy to cause the phenomenon of solder cracking between the circuit boards 4, 4' and the electronic components 5, 5' and lead to damage.

BRIEF SUMMARY OF THE INVENTION

In view of the above, the primary objective of the present disclosure is to provide a circuit board mounting support, which could effectively support a weight of an integrated electronic circuit, so that a circuit board would not be deformed due to vibration, reducing a risk of solder cracking of the circuit board and increasing service life of the circuit board.

The present disclosure provides a circuit board mounting support that is adapted to support a first electronic circuit integration, including a bearing member and a plurality of legs, wherein the first electronic circuit integration includes a circuit board and at least one electronic component engaged with a first surface of the circuit board. The circuit board has a mounting area for mounting the electronic component and a second surface opposite to the first surface. The bearing member includes a groove and an engaging portion connected to a peripheral edge of the groove, wherein a corresponding area is defined on the bearing member and corresponds to the mounting area of the circuit board. When the bearing member is engaged with the circuit board, both of an opening of the groove and the engaging portion face the second surface. The legs are adapted to be engaged with the bearing member, wherein a junction that each of the legs is engaged with the bearing member is located out of the corresponding area.

In an embodiment, when the first electronic circuit integration further includes a dissipating apparatus, the corresponding area corresponds to an area occupied by the dissipating apparatus on the circuit board.

In an embodiment, further including a fixing member adapted to support the circuit board and located on the second surface, wherein when the bearing member is engaged with the circuit board, the fixing member is received in the groove and is located in the corresponding area.

In an embodiment, the fixing member is engaged with the dissipating apparatus via a plurality of bolts, thereby fixing the circuit board between the fixing member and the dissipating apparatus.

In an embodiment, the fixing member has a recess portion and two lateral portions respectively located on two sides of the recess portion; when the fixing member is engaged with the circuit board, the lateral portions are in contact with the second surface, and a space is formed between the recess portion and the second surface.

In an embodiment, further including a first damping device that is connected to the bearing member and is located in the corresponding area and elastically abuts against a bottom of the fixing member.

In an embodiment, the first damping device includes at least one contact spring extending from a bottom of the bearing member the at least one contact spring has an abutting portion for abutting against the fixing member and an inclined extending portion connected between the bottom of the bearing member and the abutting portion.

In an embodiment, further including a second damping device that is connected to the bearing member and is located out of the corresponding area and elastically abuts against at least one of the legs.

In an embodiment, the second damping device includes at least one damping portion; the at least one damping portion has a base and a contact spring; the base is connected to a side edge of the engaging portion, and the contact spring has an abutting portion abutting against at least one of the legs and an extending portion connected between the abutting portion and the base.

In an embodiment, further including a third damping device that is disposed in the groove of the bearing member and elastically abuts against an outside of the recess portion of the fixing member.

In an embodiment, the third damping device includes at least one elastic device; the at least one elastic device has an abutting pin penetrating through a groove wall of the groove and a spring disposed between the abutting pin and the groove wall; the spring is adapted to provide a force to urge the abutting pin to continuously abut against the outside of the recess portion.

With the aforementioned design, the first electronic circuit integration could be provided on the circuit board mounting support, thereby engaging the circuit board with the bearing member and effectively supporting the load of the first electronic circuit integration. When the first electronic circuit integration is subjected to a mechanical vibration, the bearing member could provide a buffering effect, so that the circuit board would not flexure and warp due to the mechanical vibration, reducing the risk of phenomenon of solder cracking of the circuit board and increasing service life of the circuit board. Additionally, another circuit board could be disposed below the bearing member to meet the performance requirements of the electronic product and achieve the purpose of multi-layer design circuit board.

Moreover, the first damping device, the second damping device, and the third damping device could enhance the effect of buffering and lateral buffering, thereby strengthening the structural stability of the circuit board mounting support.

BRIEF DESCRIPTION OF THE SEVERAL VIEWS OF THE DRAWINGS

The present disclosure will be best understood by referring to the following detailed description of some illustrative embodiments in conjunction with the accompanying drawings, in which.

DETAILED DESCRIPTION OF THE INVENTION

Figure 3:
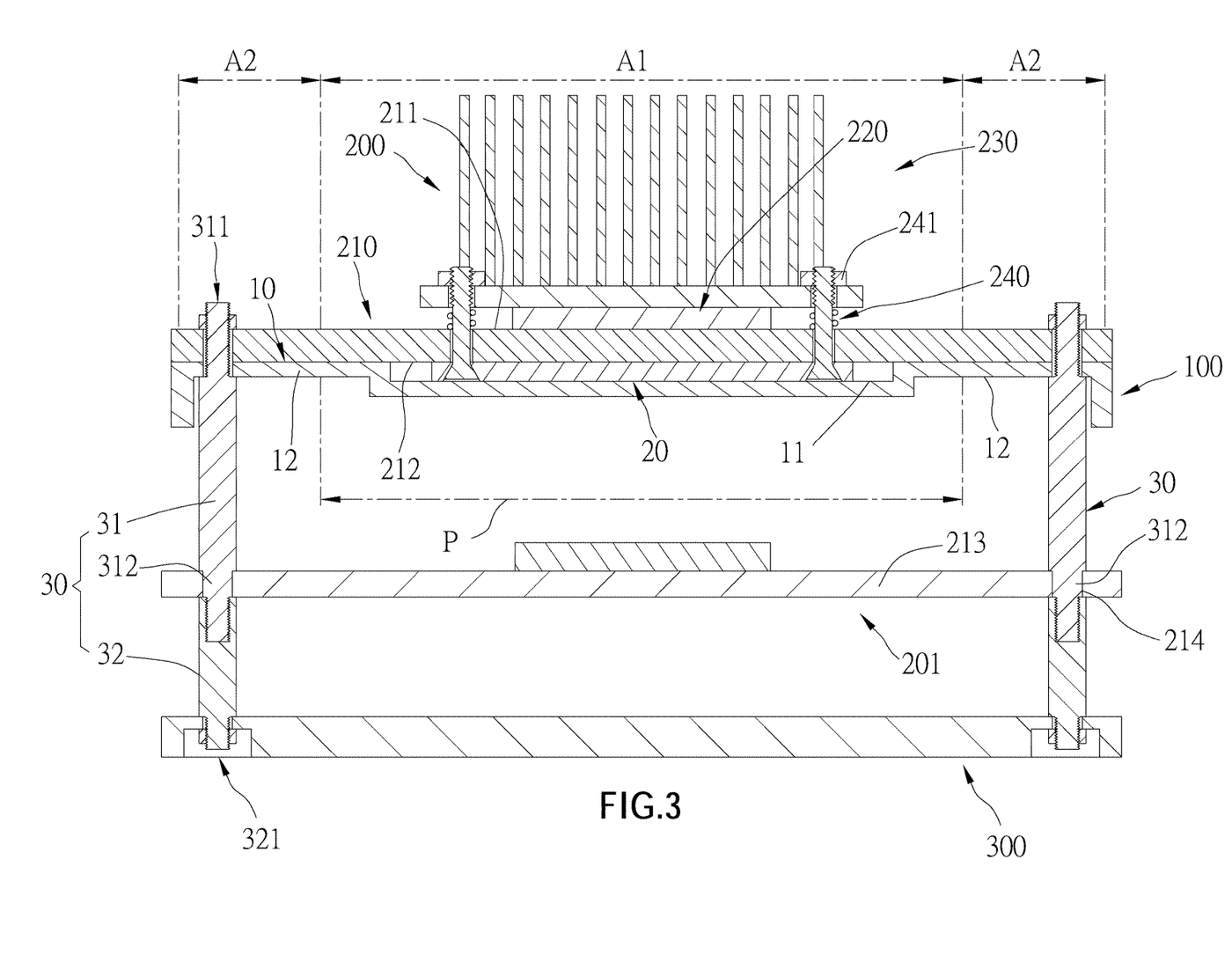
FIG. 3 is a schematic sectional view of the circuit board mounting support according to a first embodiment of the present disclosure.

A circuit board mounting support 100 according to a first embodiment of the present disclosure is illustrated in FIG. 3.

In the current embodiment, the circuit board mounting support 100 is adapted to support a first electronic circuit integration 200 and to be provided on a body 300 of an electronic device. To illustrate easily, FIG. 3 simply illustrates a circuit board 210 of the first electronic circuit integration 200, at least one electronic component 220 engaged with a first surface 211 of the circuit board 210, and a dissipating apparatus 230 engaged with the circuit board 210, wherein the dissipating apparatus 230 is in contact with the electronic component 220 to dissipate heat generated by the operating electronic component 220, and is located on the first surface 211 of the circuit board 210. The circuit board 210 has a mounting area A1 for mounting the at least one electronic component 220 and a non-mounting area A2 without mounting the electronic component 220. In the current embodiment, the mounting area A1 is located at a middle area of the circuit board 210, and the non-mounting area A2 surrounds the mounting area A1 and is located at a peripheral area of the circuit board 210.

In the current embodiment, the electronic component 220 is a CPU as an example, and the dissipating apparatus 230 is a heat sink made of aluminum alloy as an example. Additionally, the circuit board 210 has a second surface 212 opposite to the first surface 211.

In the current embodiment, the circuit board mounting support 100 includes a bearing member 10, a fixing member 20, and a plurality of legs 30.

In the current embodiment, the bearing member 10 is a plate and is engaged with the circuit board 210 via the legs 30 and is located on the second surface 212 of the circuit board 210. Referring to FIG. 3, the bearing member 10 includes a groove 11 and an engaging portion 12 connected around a peripheral edge of the groove 11, wherein the engaging portion 12 surrounds the peripheral edge of the groove 11. A corresponding area P is defined on the bearing member 10 and corresponds to the mounting area A1 of the circuit board 210, wherein an area of the corresponding area P is smaller than or equal to an area of the mounting area A1. In the current embodiment, the groove 11 is located in the corresponding area P, and a part of the engaging portion 12 is also located in the corresponding area P, while the other part of the engaging portion 12 is located out of the corresponding area P. When the bearing member 10 is engaged with the circuit board 210, an opening of the groove 11 faces the second surface 212, and the engaging portion 12 faces and is in contact with the second surface 212 of the circuit board 210. In the current embodiment, the area of the corresponding area P is equal to the area of the mounting area A1. In other embodiments, the corresponding area P could correspond to an area occupied by the dissipating apparatus 230 on the circuit board 210. In an embodiment, the area of the corresponding area P is equal to the area of the area occupied by the dissipating apparatus 230 on the circuit board 210.

In the current embodiment, the fixing member 20 is a flat plate and is adapted to support the circuit board 210 and is located on the second surface 212. The fixing member 20 is engaged with the dissipating apparatus 230 via a plurality of bolts 240 and a plurality of nuts 241, wherein the circuit board 210 is fixed between the fixing member 20 and the dissipating apparatus 230. Referring to FIG. 3, when the bearing member 10 is engaged with the circuit board 210, the fixing member 20 is located in the corresponding area P. More specifically, the fixing member 20 is located in the groove 11 of the bearing member 10, wherein a bottom surface of the fixing member 20 abuts against a bottom of the groove 11, and a top surface of the fixing member 20 is in contact with the second surface 212 of the circuit board 210.

The legs 30 are adapted to be engaged with the bearing member 10 and the body 300, wherein a junction that each of the legs 30 is engaged with the bearing member 10 is located out of the corresponding area P. In the current embodiment, each of the legs 30 is formed by engaging a first section 31 and a second section 32 in a screwing way, wherein a free end 311 of the first section 31 with an externally threaded section is fixed to the engaging portion 12 of the bearing member 10 and the non-mounting area A2 of the circuit board 210 via a nut, thereby engaging the bearing member 10 with the circuit board 210. A free end 321 of the second section 32 of each of the legs 30 with an externally threaded section is fixed to the body 300 via a nut, thereby engaging the circuit board 210 with the body 300.

Additionally, the first section 31 has a small diameter section 312 at a position close to another end of the first section 31 opposite to the free end 311 of the first section 31, wherein the small diameter section 312 is adapted to penetrate through a through hole 214 of a circuit board 213 of a second electronic circuit integration 201, thereby engaging the second electronic circuit integration 201 with the body 300.

Since the bearing member 10 could support a load of the circuit board 210 of the first electronic circuit integration 200, the circuit board mounting support 100 could prevent the circuit board 210 from flexure and warping resulted from vibration (e.g. the vibration generated when the cooling fan is running). Since the legs 30 are disposed in the non-mounting area A2 of the circuit board 210, the legs 30 are also disposed in a non-mounting area of a circuit board 213 of the second electronic circuit integration 201 when the second electronic circuit integration 201 is mounted on the body 300. In this way, the circuit layout of the circuit board 213 of the second electronic circuit integration 201 does not need to be changed for the installation of the legs 30, which keeps the freedom of the circuit layout design.

A circuit board mounting support 100' according to a second embodiment of the present disclosure is illustrated in FIG. 4 to FIG. 7.

Referring to FIG. 4 to FIG. 7, the circuit board mounting support 100' of the current embodiment includes a bearing member 10', a fixing member 20', a plurality of legs 30, a first damping device 40, a second damping device 50, and a third damping device 60, wherein the legs 30 has the same structure as that of the first embodiment.

Figure 5:
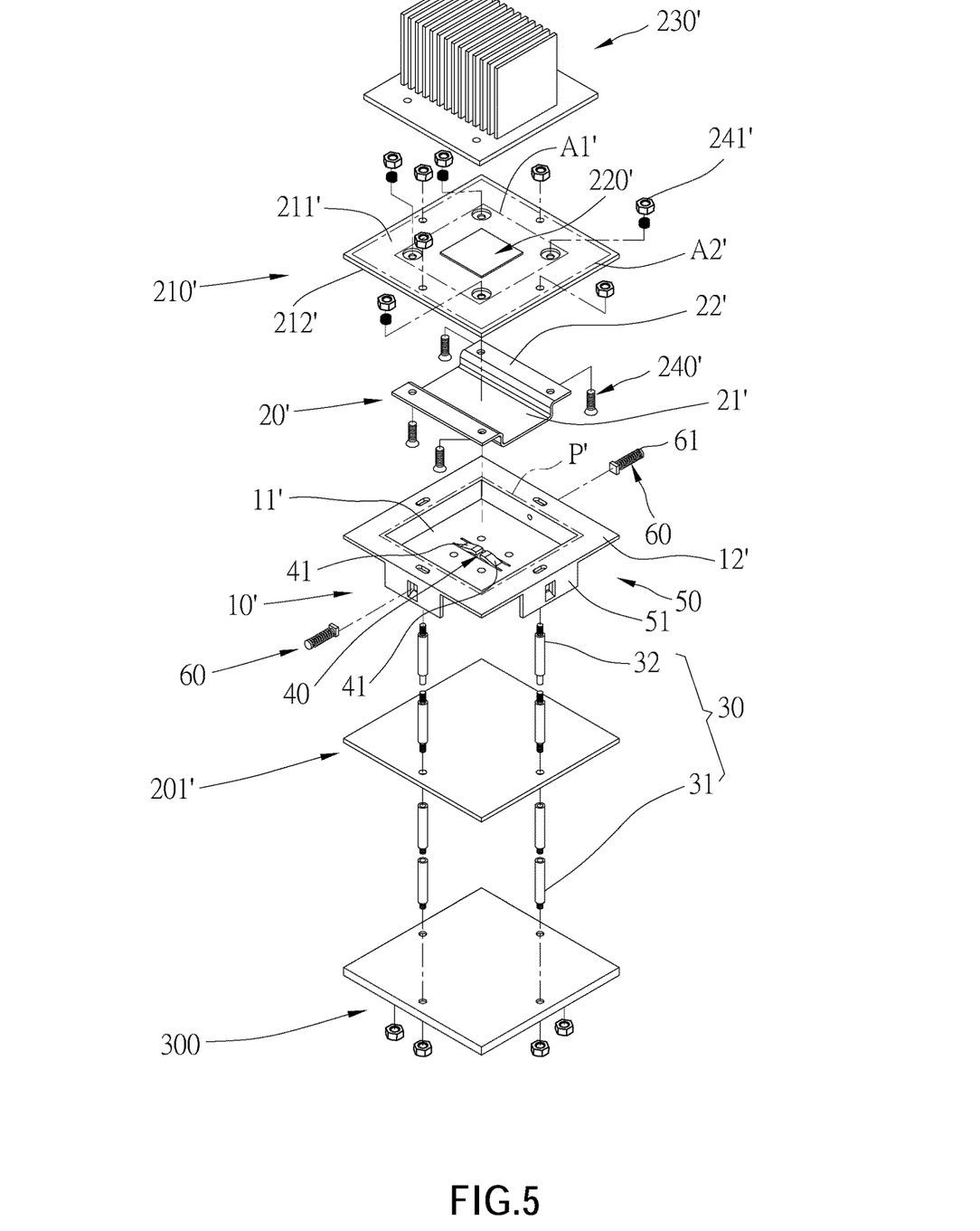
FIG. 5 is an exploded view of the circuit board mounting support according to the second embodiment of the present disclosure.
Figure 6:
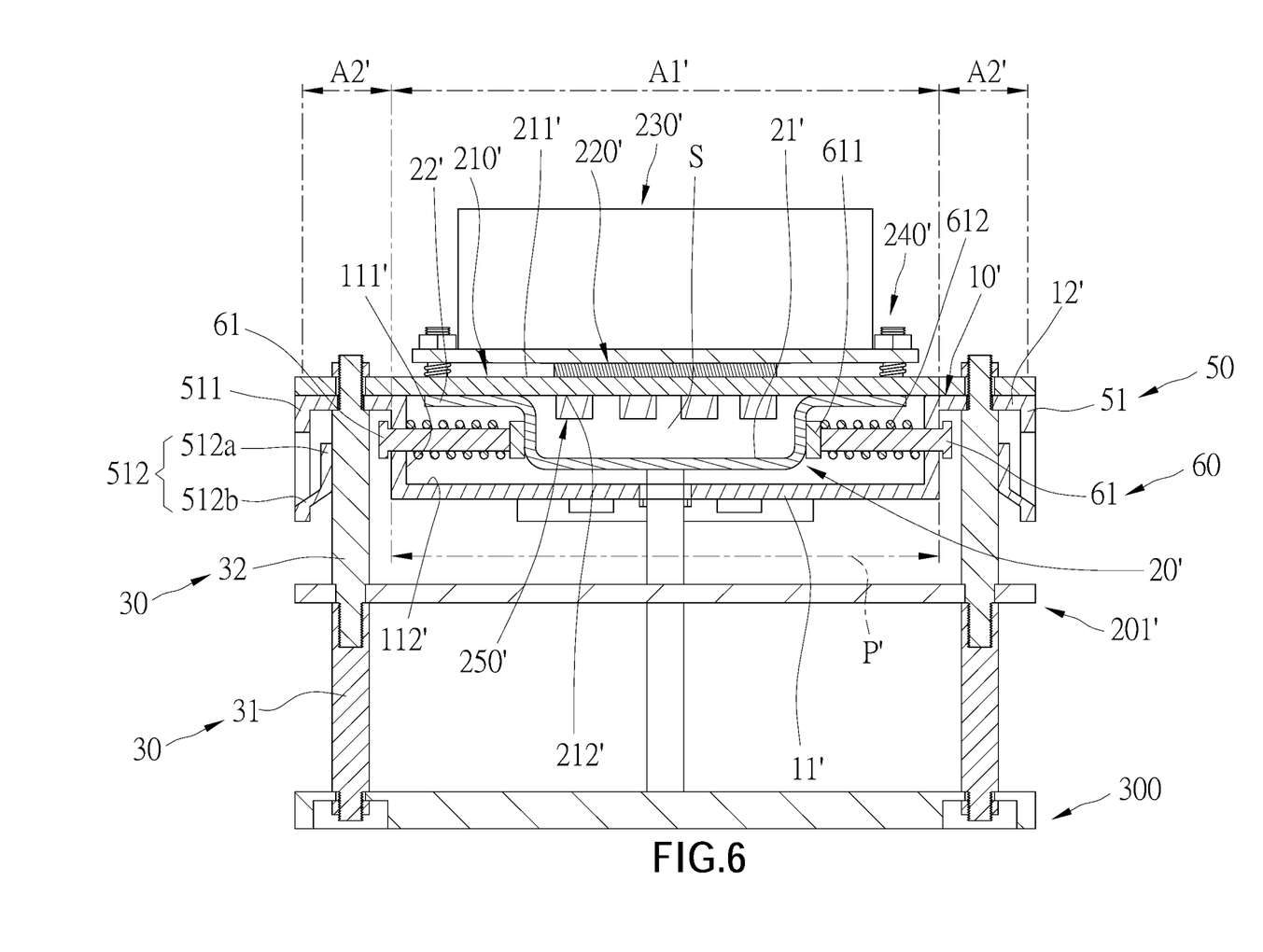
FIG. 6 is a sectional view along the 6-6 line in FIG. 4.

Referring to FIG. 5 and FIG. 6, a first electronic circuit integration 200' of the current embodiment includes a circuit board 210', an electronic component 220' engaged with a first surface 211' of the circuit board 210', and a dissipating apparatus 230' engaged with the circuit board 210', wherein the dissipating apparatus 230' is located on the first surface 211' of the circuit board 210'. As the functional requirements and the requirements for operating efficiency of electronic devices are increasing, the electronic devices are usually equipped with electronic components on both sides of the circuit board of the electronic devices. Referring to FIG. 6, the first electronic circuit integration 200' further includes a plurality of second electronic components 250' engaged with a second surface 212' of the circuit board 210' opposite to the first surface 211'. The circuit board 210' has a mounting area A1' for providing the electronic component 220' and the second electronic components 250' and a non-mounting area A2' without mounting the electronic component 220' and the second electronic components 250'. In the current embodiment, the mounting area A1' is located at a middle area of the circuit board 210', and the non-mounting area A2' surrounds the mounting area A1' and is located at a peripheral area of the circuit board 210'.

Referring to FIG. 4 to FIG. 7, a corresponding area P' is defined on the bearing member 10', wherein when the bearing member 10' is engaged with the circuit board 210', an area of the corresponding area P' is equal to an area of the mounting area A1' of the circuit board 210'. The bearing member 10' has a groove 11' and an engaging portion 12', wherein in the current embodiment, the groove 11' is located in the corresponding area P', and the engaging portion 12' is located out of the corresponding area P' and surrounds the groove 11'. When the bearing member 10' is engaged with the circuit board 210', an opening of the groove 11' faces the second surface 212' of the circuit board 210', and the engaging portion 12' is in contact with the second surface 212'.

Figure 7:
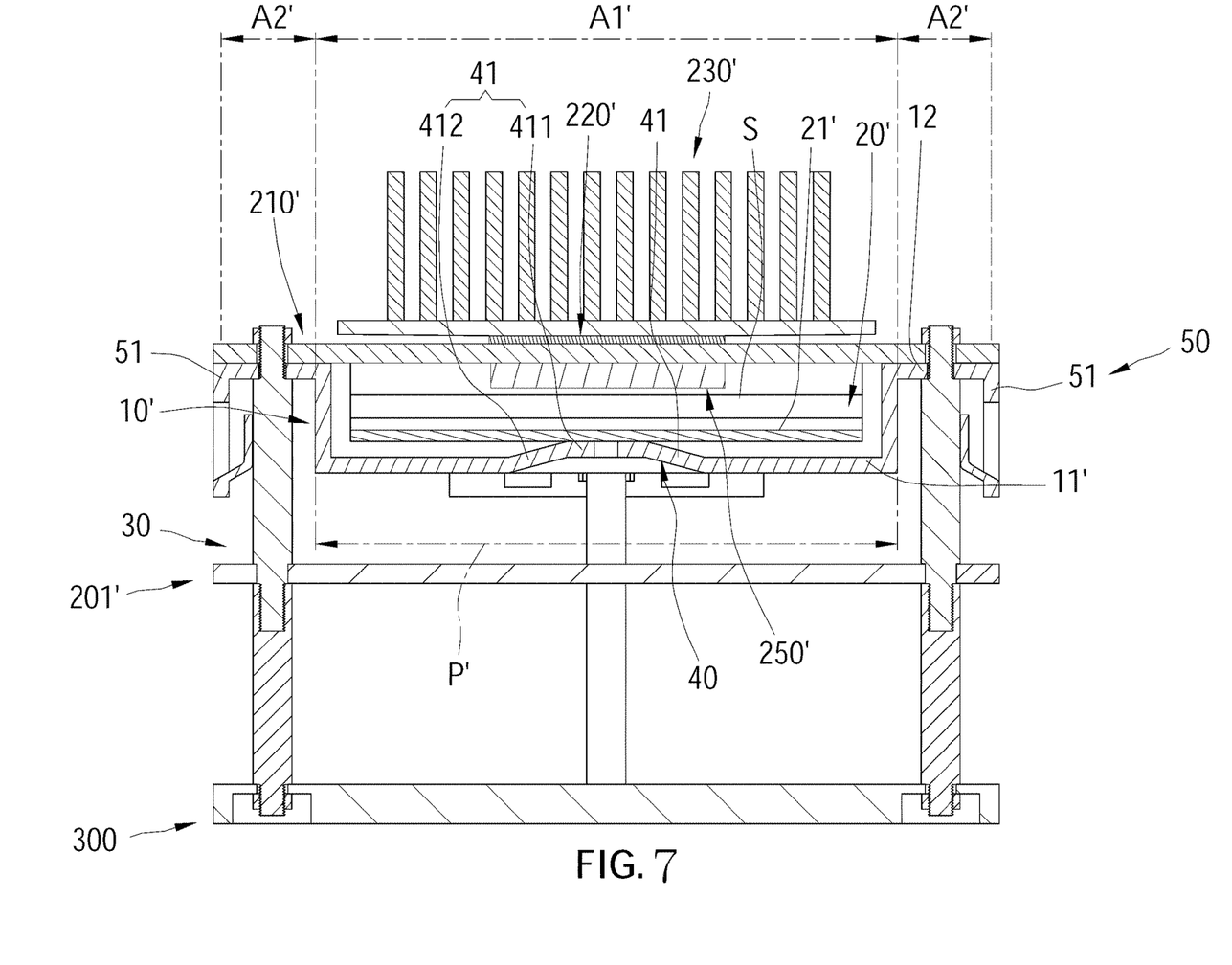
FIG. 7 is a sectional view along the 7-7 line in FIG. 4.

Referring to FIG. 5 to FIG. 7, the fixing member 20' has a recess portion 21' and two lateral portions 22' respectively located on two sides of the recess portion 21'. Referring to FIG. 6 and FIG. 7, when the fixing member 20' is engaged with the circuit board 210' via a plurality of bolts 240' and a plurality of nuts 241', the two lateral portions 22' are in contact with the second surface 212' of the circuit board 210', and a space S is formed between the recess portion 21' and the second surface 212' of the circuit board 210'. In this way, the recess portion 21' of the fixing member 20' could get away from the second electronic components 250' provided on the second surface 212', allowing the second electronic components 250' to be located in the space S.

Figure 4:
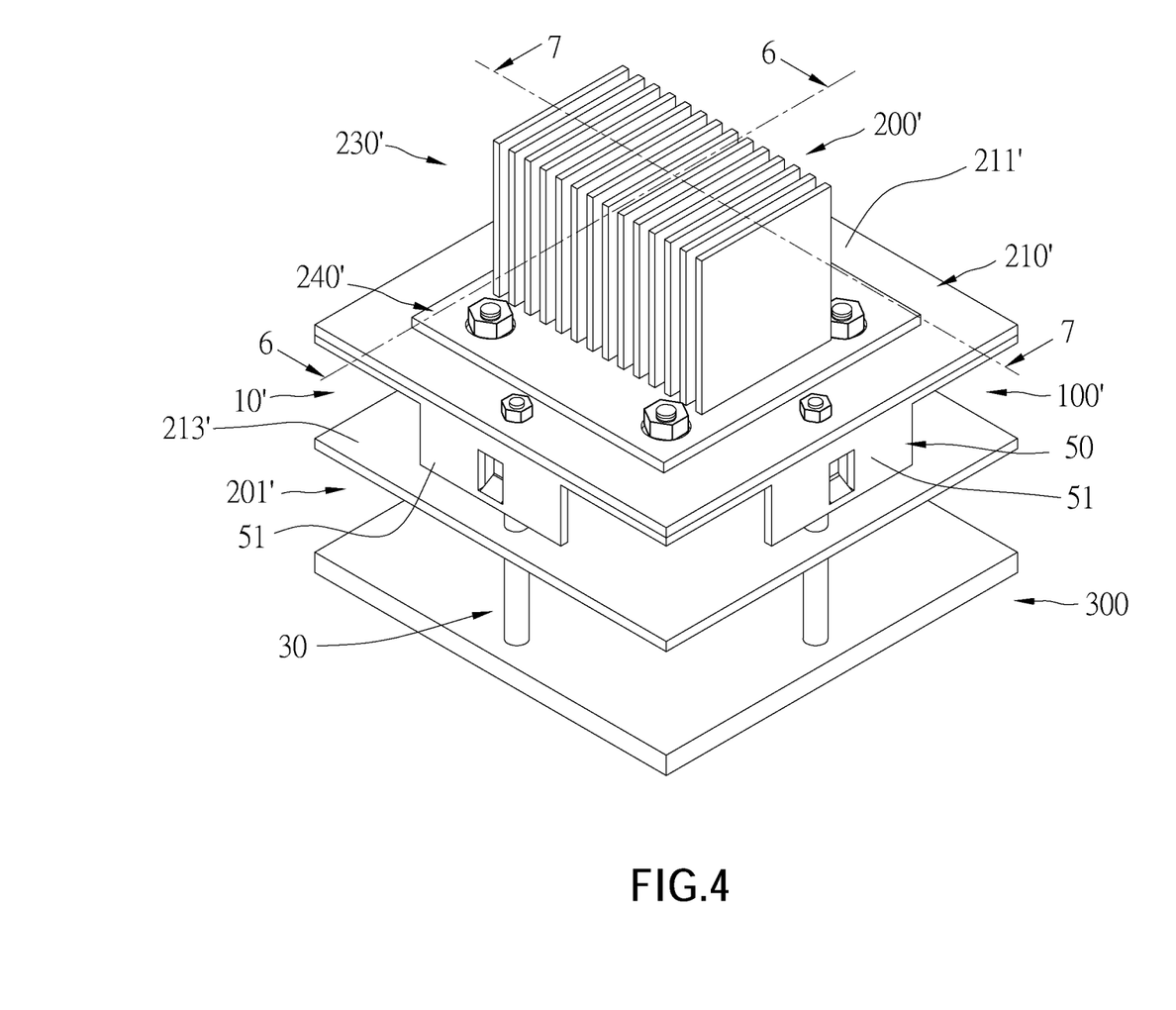
FIG. 4 is a perspective view of the circuit board mounting support according to a second embodiment of the present disclosure.

In addition, referring to FIG. 4 to FIG. 6, a circuit board 213' of a second electronic circuit integration 201' is disposed between the first section 31 and the second section 32 of the legs 30, thereby engaging the circuit board 213' on a body 300 of an electronic device.

The first damping device 40 is engaged with the bearing member 10' and is located in the corresponding area P', wherein the first damping device 40 elastically abuts against a bottom of the fixing member 20' via the lateral portions 22'. Referring to FIG. 7, in the current embodiment, the first damping device 40 is located in the groove 11' and includes two contact springs 41 integrally formed by extending from a bottom of the bearing member 10', wherein each of the contact springs 41 has an abutting portion 411 abutting against the recess portion 21' of the fixing member 20' and an inclined extending portion 412 connected to the bottom of the bearing member 10'. In this way, when the first electronic circuit integration 200' is subjected to a mechanical vibration, the first damping device 40 could soften the vibration intensity of the circuit board 210', the bearing member 10', and the fixing member 20', enhancing the effect of buffering and damping. In practice, the number of the contact springs 41 could be one or more than two.

Referring to FIG. 6 and FIG. 7, the second damping device 50 is engaged with the bearing member 10' and is located out of the corresponding area P' and is elastically abuts against at least one of the legs 30. In the current embodiment, the second damping device 50 includes four damping portions 51, wherein each of the damping portions 51 has a base 511 and a contact spring 512. The base 511 is connected to a side edge of the engaging portion 12', and the contact spring 512 has an abutting portion 512a abutting against the second section 32 of the legs 30 and an extending portion 512b connected between the abutting portion 512a and the base 511. In this way, when the circuit board mounting support 100' is subjected to a lateral vibration, the damping portions 51 of the second damping device 50 could absorb an impact energy between the bearing member 10' and each of the legs 30, providing the effect of lateral buffering and reducing a relative displacement between the bearing member 10' and each of the legs 30.

In other embodiments, the number of the damping portion 51 of the second damping device 50 could be at least one, and the contact spring 512 of the damping portion 51 could be replaced with a spring or other elastic elements such as rubber, which could elastically abut against the legs 30 to achieve the purpose of lateral buffering.

Referring to FIG. 5 and FIG. 6, the third damping device 60 is disposed in the groove 11' of the bearing member 10' and elastically abuts against an outside of the recess portion 21'. In the current embodiment, the third damping device 60 includes two elastic devices 61, wherein each of the elastic devices 61 has an abutting pin 611 penetrating through a groove wall 112' of the groove 11' and a spring 612 disposed between the abutting pin 611 and the groove wall 112'. The spring 612 is adapted to provide a force to urge the abutting pin 611 to continuously abut against the outside of the recess portion 21'. In this way, when the circuit board mounting support 100' is subjected to a lateral vibration, the elastic devices 61 of the third damping device 60 could absorb an impact energy between the bearing member 10' and the fixing member 20' providing the effect of lateral buffering and reducing a relative displacement between the bearing member 10' and the fixing member 20'.

In other embodiments, the number of the elastic device 61 of the third damping device 60 could be at least one.

With the aforementioned design, when the fixing member 20' is engaged with the circuit board 210', the recess portion 21' could evade the second electronic components 250' provided on the second surface 212', allowing the second electronic components 250' to be located in the space S. Additionally, the first damping device 40, the second damping device 50, and the third damping device 60 could enhance the effect of buffering and lateral buffering, thereby strengthening the structural stability of the circuit board mounting support 100'.

It must be pointed out that the embodiments described above are only some preferred embodiments of the present disclosure. All equivalent structures which employ the concepts disclosed in this specification and the appended claims should fall within the scope of the present disclosure.

What is claimed is:

1. A circuit board mounting support, which is adapted to support a first electronic circuit integration, wherein the first electronic circuit integration comprises a circuit board and at least one electronic component engaged with a first surface of the circuit board; the circuit board has a mounting area for mounting the electronic component and a second surface opposite to the first surface; the circuit board mounting support comprising:
a bearing member comprising a groove and an engaging portion connected to a peripheral edge of the groove, wherein a corresponding area is defined on the bearing member and corresponds to the mounting area of the circuit board; the groove is located in the corresponding area; when the bearing member is engaged with the circuit board, both of an opening of the groove and the engaging portion face the second surface, and the engaging portion is in contact with the second surface of the circuit board; and
a plurality of legs adapted to be engaged with the bearing member, wherein a junction that each of the legs is engaged with the bearing member is located out of the corresponding area.

2. The circuit board mounting support as claimed in claim 1, wherein the first electronic circuit integration further comprises a dissipating apparatus, and the corresponding area corresponds to an area occupied by the dissipating apparatus on the circuit board.

3. The circuit board mounting support as claimed in claim 2, further comprising a fixing member adapted to support the circuit board and located on the second surface, wherein the bearing member is engaged with the circuit board and the fixing member located in the corresponding area is accommodated in the groove.

4. The circuit board mounting support as claimed in claim 3, wherein the fixing member is engaged with the dissipating apparatus via a plurality of bolts and a plurality of nuts, thereby fixing the circuit board between the fixing member and the dissipating apparatus.

5. The circuit board mounting support as claimed in claim 3, wherein the fixing member has a recess portion and two lateral portions respectively located on two sides of the recess portion; when the fixing member is engaged with the circuit board, the lateral portions are in contact with the second surface, and a space is formed between the recess portion and the second surface.

6. The circuit board mounting support as claimed in claim 3, further comprising a first damping device that is connected to the bearing member and is located in the corresponding area and elastically abuts against a bottom of the fixing member.

7. The circuit board mounting support as claimed in claim 6, wherein the first damping device comprises at least one contact spring extending from a bottom of the bearing member; the at least one contact spring has an abutting portion for abutting against the fixing member; and an inclined extending portion connected between the bottom of the bearing member and the abutting portion.

8. The circuit board mounting support as claimed in claim 1, further comprising a second damping device that is connected to the bearing member and is located out of the corresponding area and elastically abuts against at least one of the legs.

9. The circuit board mounting support as claimed in claim 8, wherein the second damping device comprises at least one damping portion; the at least one damping portion has a base and a contact spring; the base is connected to a side edge of the engaging portion, and the contact spring has an abutting portion abutting against at least one of the legs and an extending portion connected between the abutting portion and the base.

10. The circuit board mounting support as claimed in claim 5, further comprising a third damping device that is disposed in the groove of the bearing member and elastically abuts against an outside of the recess portion of the fixing member.

11. The circuit board mounting support as claimed in claim 10, wherein the third damping device comprises at least one elastic device; the at least one elastic device has an abutting pin penetrating through a groove wall of the groove and a spring disposed between the abutting pin and the groove wall; the spring is adapted to provide a force to urge the abutting pin to continuously abut against the outside of the recess portion.

* * * * *